United States Patent [19]

Katakura

[11] 4,203,043
[45] May 13, 1980

[54] TRISTATE CHANGEOVER SWITCHING CIRCUIT

[75] Inventor: Masayuki Katakura, Yokohama, Japan

[73] Assignee: Tokyo Shibaura Electric Co., Ltd., Kawasaki, Japan

[21] Appl. No.: 903,246

[22] Filed: May 5, 1978

[30] Foreign Application Priority Data

May 10, 1977 [JP] Japan .................................. 52-53349
Nov. 15, 1977 [JP] Japan ................................ 52-136981

[51] Int. Cl.² ...................... H03K 17/00; H03K 3/29
[52] U.S. Cl. ................................... 307/254; 307/289; 307/286 R; 307/317 R
[58] Field of Search ........... 307/254, 259, 289, 317 R, 307/32, 38, 52, 60, 296

[56] References Cited

U.S. PATENT DOCUMENTS 3,671,763 6/1972 Maley et al. ..................... 307/289

FOREIGN PATENT DOCUMENTS 4324570 2/1966 Japan ................................. 307/289
48-33538 10/1973 Japan .
49-32466 8/1974 Japan .

*Primary Examiner*—Stanley D. Miller, Jr.
*Assistant Examiner*—B. P. Davis
*Attorney, Agent, or Firm*—Oblon, Fisher, Spivak, McClelland & Maier

[57] ABSTRACT

A switching circuit having a current source connected to first, second and third lines in order to supply first and second current signals whose total amount remains constant to the first and second current lines, respectively. The current source further supplies a constant bias $I_B$ to the third line. First and second diode pairs are respectively connected in parallel in opposite directions between the first and third signal current lines, and between the second and third signal lines, respectively. First and second transistors are connected to the three signal current lines, respectively, with the base voltages of these transistors kept constant at the same voltage level. Accordingly, current passing through the first and second diode pairs change flow direction in accordance with the incremental variations of current flowing in the first and second lines. As a result, the output voltages at the collectors of the first and second transistors represent any of the three prescribed states in accordance with the extent of the incremental current variation in the first and second lines.

9 Claims, 6 Drawing Figures

TRISTATE CHANGEOVER SWITCHING CIRCUIT

This invention relates to a switching circuit whose operation is to switch to any of the prescribed three states in accordance with a D.C. voltage level of a single input signal and more particularly to an integrated switching circuit for an audio apparatus.

In recent years, circuit parts incorporated in an audio apparatus such as a tape recorder tend to be integrated in order to render such audio apparatus compact. Demand has been made to integrate particularly the switching circuit of, for example, a tape recorder, together with circuits used for recording, reproduction and muting. Two-state electronic switching circuits known to date include the type whose operation is to switch to two prescribed states, namely, the ON and OFF states in accordance with the level of D.C. voltage applied to the input terminal of an audio apparatus or tape recorder. Incorporation of said two-state electronic switching circuit has been considered to provide a three-state electronic switching circuit. However, it has been pointed out that a three-state electronic switching circuit produced by incorporating a two-state electronic switching circuit unavoidably has a much too complicated arrangement and too many input terminals or input pins, proving unsuitable for an IC version of the switching circuit.

It is accordingly an object of this invention to provide a novel switching circuit of simple arrangement whose operation can be switched to any of the prescribed three states in accordance with the D.C. voltage level of one input signal.

Another object of the invention is to provide a switching circuit admitting of easy integration whose operation can be switched to any of the prescribed three states in accordance with the D.C. voltage level of one input signal.

According to this invention, there is provided a switching circuit which comprises a current source including an input line for receiving an input signal, first and second signal current lines supplied with two different signal currents $(I_0+\Delta I)$, $(I_0-\Delta I)$ respectively whose total amount remains constant and one of which has an increment $+\Delta I$ corresponding to a decrement $-\Delta I$ in the other, and a third signal current line supplied with a constant current; a first pair of diodes which are connected in parallel in the opposite directions between the first and third signal current lines and in which the current direction is varies in accordance with the value of current variation $\Delta I$; a second pair of diodes which are connected in parallel in the opposite directions between the second and third signal current lines and in which the current direction varies in accordance with the value of current variation $\Delta I$; first and second constant current circuits connected to the first and second signal current lines respectively to restrict an amount of introduced current to a prescribed level; and first and second output lines which are connected to the first and second signal current lines respectively and an output voltage which varies in accordance with the direction of current flowing through the respective pairs of the first and second diodes.

This invention can be more fully understood from the following detailed description when taken in conjunction with the accompanying drawings, in which.

Figure 1:
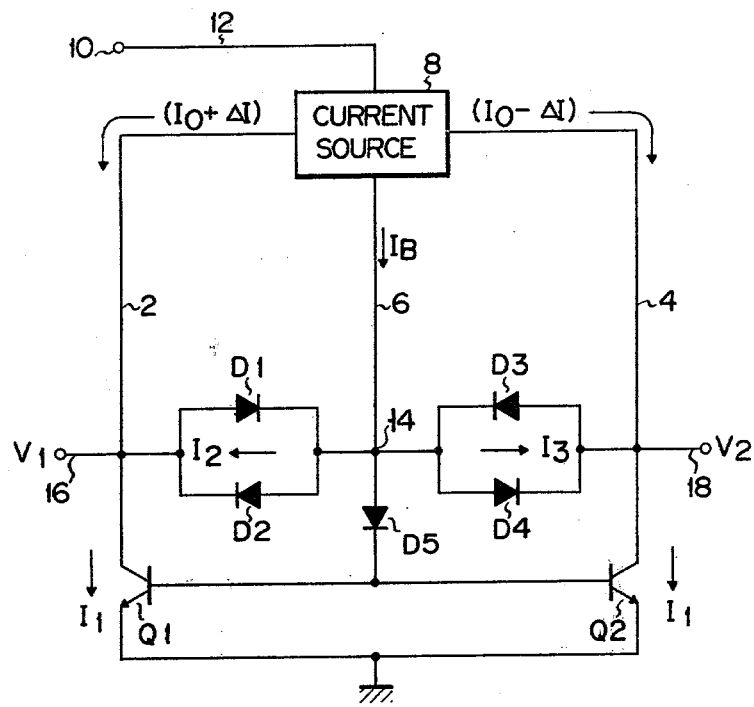
FIG. 1 shows the arrangement of a switching circuit embodying this invention.

There will now be described by reference to the accompanying drawings a switching circuit embodying this invention. FIG. 1 schematically shows the arrangement of a three-state switching circuit embodying this invention. The switching circuit has a current source 8 for supplying current to first, second and third signal current lines 2, 4, 6. A signal current line 12 which is connected to a signal input terminal 10 of the switching circuit is connected to said current source 8. This current source 8 supplies the signal current lines 2, 4 with current having different values $(I_0+\Delta I)$, $(I_0-\Delta I)$ in accordance with the D.C. voltage level of an input signal received at the input terminal 10. The total amount of currents $(I_0+\Delta I)$, $(I_0-\Delta I)$ supplied from the current source 8 to the first and second signal current lines 2, 4 is fixed at $2I_0$. Both currents always vary at the same rate of an absolute value $|\Delta I|$. The current source 8 also supplies a constant bias current $I_B$ to the third signal current line 6. A first pair of diodes D1, D2 are connected in parallel in the opposite directions between the first and third signal current lines 2, 6. A second pair of diodes D3, D4 are similarly connected in parallel in the opposite directions between the second and third signal current lines 4, 6. The first signal current line 2 is connected to the collector of a first NPN transistor Q1. The second signal current line 4 is connected to the collector of a second NPN transistor Q2. The third signal current line 6 is connected to a junction 14 between the first paired diodes D1, D2 and the second paired diodes D3, D4. The bases of the first and second transistors Q1, Q2 are commonly connected to the junction 14 through a diode D5 connected in the forward direction. The emitters of the first and second transistors Q1, Q2 are commonly connected to ground or to a negative power source. First and second output lines 16, 18 are connected to the first and second signal current lines 2, 4 respectively. One or both of the first paired diodes D1, D2 may be replaced by Zener diodes or a series circuit of a plurality of diodes. Similarly, one or both of the second paired diodes D3, D4 may be replaced by Zener diodes or a series circuit of a plurality of diodes. If the switching circuit requires no quick response, the diode D5 can be omitted. Instead of the diode D5, a series connection of two or more diodes or Zener diodes may be used and, in this case, the DC level of the output voltages v1 and V2 can be arbitrarily shifted.

Where, with the switching circuit arranged as described above, the first and second transistors Q1, Q2 have the same characteristics, then the same level of base voltage is applied to the bases of said transistors Q1, Q2. Since the emitters of said transistors Q1, Q2 are mutually connected, the same level of collector current I₁ is supplied to the collectors of said transistors Q1, Q2. With the switching circuit of this invention, the following two equations result:

$$I_2 + I_3 = I_B \quad (1)$$

$$I_1 = (I_0 + \Delta I) + I_2 = (I_0 - \Delta I) + I_3 \quad (2)$$

In the above equations, $I_2$ denotes positive current flowing from the junction 14 to the collector of the first transistor Q1. $I_3$ represents positive current supplied from the junction 14 to the collector of the second transistor Q2. Base current also flows through the base-emitter passage of the first and second transistors Q1, Q2. However, this current is so small as to be ignored.

The following equations are derived from the above equations (1), (2)

$$I_2 = \tfrac{1}{2} I_B - \Delta I \quad (3)$$

$$I_3 = \tfrac{1}{2} I_B + \Delta I \quad (4)$$

It is seen from the above equations (3) and (4) that the direction of the currents $I_2$ and $I_3$ varies according to whether current variation $\Delta I$ is larger or smaller than $I_B/2$. Namely, in case of $\Delta I > I_B/2$, the current $I_3$ flows in a direction shown by the arrow of FIG. 1, while the current $I_2$ flows in the opposite direction to the arrow of FIG. 1. In case of $I_B/2 > \Delta I > -I_B/2$, the currents $I_2$, $I_3$ are respectively supplied to the directions indicated by the arrows of FIG. 1. In case of $-I_B/2 > \Delta I$, the current $I_2$ flows in the direction shown by the arrow of FIG. 1, while the current $I_3$ runs in the opposite direction to the arrow of FIG. 1.

Figure 2:
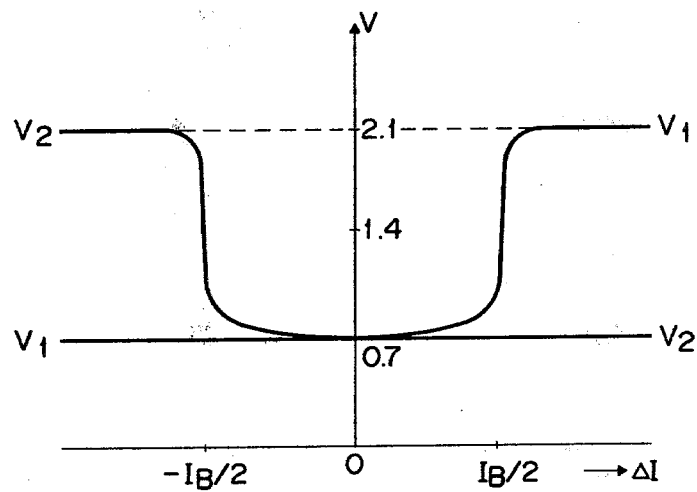
FIG. 2 is a graph showing the relationship between levels of output voltage $V_1$, $V_2$ from the two output lines of FIG. 1 and a value of variation $\Delta I$ in signal currents $(I_0+\Delta I)$, $(I_0-\Delta I)$ supplied to the first and second signal current lines.

With the switching circuit of FIG. 1, the potential of the junction 14 which is kept at a constant level is equal to a sum of the forward voltage drop $V_5$ of the diode D5 and the base-emitter voltage $V_{BE}$ of the first transistor Q1 or the second transistor Q2 (the base-emitter voltage of the first transistor Q1 is assumed to be equal to that of the second transistor Q2). Generally, the diode has the forward characteristic that the forward voltage drop remains substantially constant, independently of forward current. If the diode D5 and first and second transistors Q1, Q2 are integrated, then the forward voltage drop of the diode D5 will be approximately equal to the base-emitter voltage $V_{BE}$ of the first and second transistors Q1, Q2. Consequently, the potential of the junction 14 will stand at $2V_{BE}$. As measured from the junction 14 having a constant potential of $2V_{BE}$, the output voltages $V_1$, $V_2$ of the first and second output lines 16, 18 will change respectively, as shown in FIG. 2, by the value of current variation $\Delta I$. The graph of FIG. 2 shows the relationship between the output voltages $V_1$, $V_2$ and current variation when the switching circuit of FIG. 1 is integrated. When the switching circuit of FIG. 1 is integrated, the forward voltage drop of the diodes D1 to D5 substantially stands at 0.7 volt, a level equal to the base-emitter voltage $V_{BE}$ of the first and second transistors Q1, Q2, regardless of an amount of current flowing through the diodes D1 to D5 in the forward direction. In case of $\Delta I > I_B/2$, the current $I_3$ flows through the diode D4 in the direction of the arrow shown in FIG. 3. The current $I_2$ flows through the diode D1 in the opposite direction to the arrow of FIG. 2. Consequently, the potential $V_2$ drops from that of the junction 14 by $V_{BE}$, that is, 0.7 volt. The potential $V_1$ rises above that of the junction 14 by $V_{BE}$, that is, 0.7 volt. Where current varies within the range expressed as $I_B/2 > \Delta I > -I_B/2$, then the current $I_2$ flows through the diode D2 in the direction of the arrow shown in FIG. 1. As the result, the potential $V_1$ drops from that of the junction 14 by 0.7 volt. In case of $-I_B/2 > \Delta I$, the current $I_3$ flows through the diode D3 in the opposite direction to the arrow of FIG. 1, causing the potential $V_2$ to be increased over that of the junction 14 by 0.7 volt.

Variations in the output voltages $V_1$, $V_2$ from the first and second output lines 16, 18 may be summarized as follows:

Table I

|  | $V_1$ | $V_2$ |
|---|---|---|
| $\Delta I > I_B/2$ | $3V_{BE}$(2.1 V) | $V_{BE}$(0.7 V) |
| $I_B/2 < \Delta I < -I_B/2$ | $V_{BE}$(0.7 V) | $V_{BE}$(0.7 V) |
| $-I_B/2 < \Delta I$ | $V_{BE}$(0.7 V) | $3V_{BE}$(2.1 V) |

As is apparent from Table I above and the graph of FIG. 2, the three-state switching circuit embodying this invention causes output voltages $V_1$, $V_2$ from the output lines 16, 18 to be changed over to the prescribed three states. Namely, the present switching circuit can convert analog signals into digital signals capable of having three values.

Figure 3:
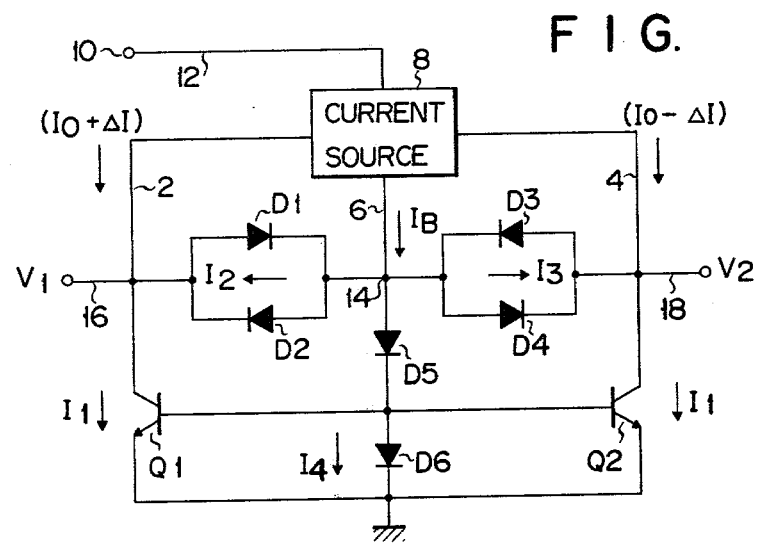
FIG. 3 shows the arrangement of a modification of the switching circuit of FIG. 1.

There will now be described by reference to FIG. 3 a modification of the switching circuit of this invention. The switching circuit of FIG. 3 further comprises a diode D6 connected between the base and emitter of the first and second transistors Q1, Q2 respectively included in the switching circuit of FIG. 1.

When the saturation current of transistors Q1, Q2 and diode D6 are all equal to each other, the following equations result relative to the switching circuit of FIG. 3, as described in connection with FIG. 1.

$$I_2 + I_3 + I_4 = I_B \quad (5)$$

$$(I_0 + \Delta I) + I_2 = I_1 \quad (6)$$

$$(I_0 - \Delta I) + I_3 = I_1 \quad (7)$$

In the above equations (5), (6), (7), $I_1$ and $I_2$ denote positive current flowing in the directions of the indicated arrows respectively. $I_4$ shows a current through the diode 6, which is designed to be equal to a current $I_1$. The three equations above (5), (6), (7) may be summarized as follows:

$$I_2 = (I_B - I_0)/3 - \Delta I \quad (8)$$

$$I_3 = (I_B - I_0)/3 + \Delta I \quad (9)$$

As seen from the above equations (8), (9), output voltages $V_1$, $V_2$ of two output lines can be changed into any of the prescribed three states according to whether current variation $\Delta I$ is larger than $(I_B - I_0)/3$, intermediate between $(I_B - I_0)/3$ and $-(I_B - I_0)/3$ or smaller than $-(I_B - I_0)/3$. For reference, the relationship between the output voltages $V_1$, $V_2$ in case of $I_B = 2I_0$ is set forth in Table II below.

Table II

|  | $V_1$ | $V_2$ |
|---|---|---|
| $\Delta I > I_B/6$ | $3V_{BE}$(2.1 V) | $V_{BE}$ |
| $I_B/6 > \Delta I > -I_B/6$ | $V_{BE}$ | $V_{BE}$ |

Table II-continued

| | $V_1$ | $V_2$ |
|---|---|---|
| $-I_B/6 > \Delta I$ | $V_{BE}$ | $3V_{BE}$ |

Table II shows the case where the saturation currents of the transistors Q1, Q2 and diode D6 are equal to each other, but in the integrated circuit the ratio of these saturation currents can be accurately controlled by a ratio of junction areas of the transistors and diode and the threshold levels of these can take any value other than $\pm I_B/6$.

With the switching circuit of FIG. 1, the bias current $I_B$ should be smaller than $2I_0$. With the switching circuit of FIG. 3, however, the currents $I_B$, $I_0$ may have any optional value. Therefore, the switching circuit of FIG. 3 affords the advantage of allowing greater latitude in the design of current source 8.

Figure 4:
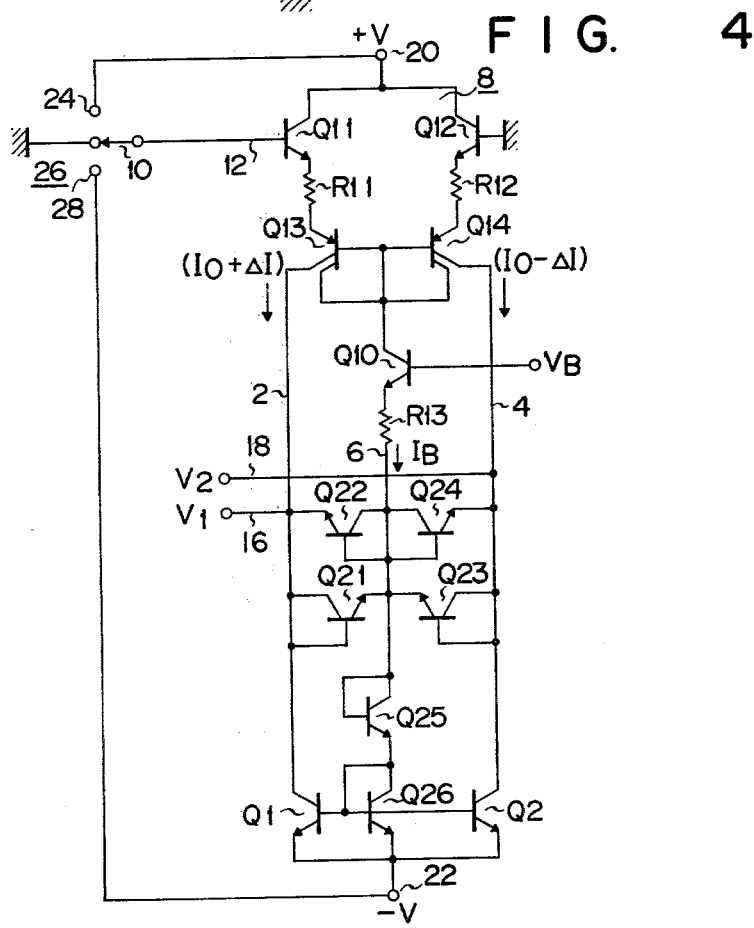
FIG. 4 is a concrete arrangement of the switching circuit of FIG. 3 when integrated.

There will now be described by reference to FIG. 4 a concrete integrated arrangement of the switching circuit of FIG. 3. The switching circuit of FIG. 4 is connected to two positive and negative power supply terminals 20, 22 for use with an audio circuit, for example, a circuit for changing the operation of a tape recorder from the recording mode to the playback mode or vice versa. The switching circuit of FIG. 4 is formed on a single chip together with other circuits such as those used for the recording, playback and muting modes. The current source 8 comprises first and second NPN transistors Q11, Q12, resistors R11, R12, first and second multicollector PNP transistors Q13, Q14, NPN transistor Q10 and resistor R13. The collectors of the paired NPN transistors Q11, Q12 are connected to the terminal 20 of the positive power source. The emitters of said transistors Q11, Q12 are connected through the respective resistors R11, R12 to the emitters of the corresponding multicollector PNP transistors Q13, Q14. The base of the first transistor Q11 is connected to the input terminal 10 of the switching circuit through a signal current line 12. The base of the second transistor Q12 is grounded. The bases of both multicollector PNP transistors Q13, Q14 are commonly connected to the collector of the NPN transistor Q10. One collector of the first multicollector PNP transistor Q13 is connected to the first signal current line 2. One collector of the second PNP multicollector transistor Q14 is connected to the second signal current line 4. The other collectors of said PNP multicollector transistors Q13, Q14 are commonly connected to the collector of the NPN transistor Q10. The emitter of this NPN transistor Q10 is connected to the third signal current line 6 through the resistor R13. The base of said transistor Q10 is connected to a constant bias power source terminal $V_B$.

Where the input terminal 10 of the switching circuit of FIG. 4 is selectively connected to either terminal 24 connected to a positive power source +V, grounded terminal 26, or terminal 28 connected to a negative power source −V, then the current source 8 will be operated as mentioned below. The multicollector transistors Q13 and Q14 act as a differential current source. Therefore, when the input terminal 10 is connected to the positive power source +V through the terminal 24, then the second multicollector transistor Q14 is turned off, causing current to be conducted from the positive power source +V to the emitter of the first multicollector transistor Q13 through the first transistor Q11 and resistor R11. Current $I_B$ flowing through the third signal current line 6 is converted to a constant current by means of the transistor Q10 and resistor R13. Since, at this time, the same amount of current is conducted through the two collectors of the first multicollector transistor Q13, the current $(I_0 + \Delta I)$ flowing through the first signal current line 2 is considered to have a value equal to that of the bias current $I_B$. The current $(I_0 - \Delta I)$ conducted through the second signal current line 4 is substantially brought to zero, because the second transistor Q12 is rendered nonconductive. Therefore the following equation result:

$$\Delta I = I_0 \text{ and}$$

$$I_B = 2I_0$$

Where the input terminal 10 is connected to the terminal 26 to be grounded, then the first and second transistors Q11, Q12 are turned on to permit an equal current to pass therethrough. Since, at this time, an equal amount of current flows through the two collectors of the first multicollector transistor Q13 as well as those of the second multicollector transistor Q14, the sum of the current flowing through the junction of the mutually connected collectors of the first and second multicollector transistors Q13 and Q14 is stabilized at a value equal to the bias current $I_B$. Accordingly, the current $I_0$ is supplied to the first signal current line 2, and the current $I_0$ passes through the second signal current line 4. At this time the bias current has a value $2I_0$ and current variation $\Delta I$ is zero.

Where the input terminal 10 is connected to the negative power source −V through the terminal 28, then only the second transistor Q12 is turned on, causing current having a value of $2I_0$ to pass through the second signal current line 4, thereby switching the current conducted through the first signal current line 2 substantially to zero.

Where the above-mentioned current variations appear in the first and second signal current lines 2, 4, then output voltages $V_1$, $V_2$ delivered from the output lines 16, 18 respectively display any of the prescribed three states according to the extent of said current variations.

With the embodiment of FIG. 4, diodes D1 to D6 are formed by connecting the base and collector of each of the transistors Q21 to Q26. The transistor Q21 corresponds to the diode D1; the transistor Q22 to the diode D2; the transistor Q23 to the diode D3; the transistor Q24 to the diode D4; the transistor Q25 to the diode D5; and the transistor Q26 to the diode D6. In the embodiment of FIG. 4 unilke the embodiment of FIG. 3, the diode-connected transistor Q26 has its emitter connected to the terminal 22 of the negative power source −V.

There will now be described by reference to FIG. 5 the case where the above-mentioned switching circuit of FIG. 4 is integrated, together with the other circuits of a tape recorder such as those used for the recording, reproduction and muting modes. The input terminal 10 of a switching circuit 30 is connected to the common terminal 36 of a switch 34 through an integration circuit 32. As is well known, the integration circuit 32 comprises a resistor 38 connected between said common terminal 36 and input terminal 10, and a capacitor 40 connected between the resistor 38 and ground. The operation of the switch 34 can be changed over by selectively connecting the common terminal 36 to a terminal 42 connected to the positive power source +V or to a grounded terminal 44. Two output lines of the switching circuit 30 are connected to a decoder 46. According to the prescribed three states represented by outputs from the two output lines 16, 18, the decoder 46 selectively sends forth a shift signal for driving a muting circuit 48, a shift signal for operating a playback circuit 50, or a shift signal for actuating a recording circuit 51. The switching circuit 30, decoder 46, muting circuit 48, playback circuit 50, and recording circuit 51 are all assembled on a single chip as an integrated circuit 52.

Figure 5:
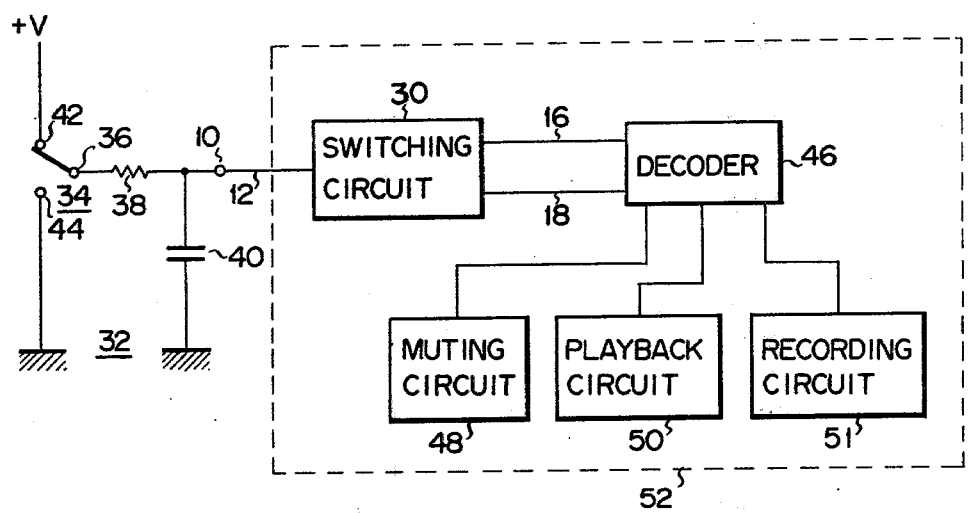
FIG. 5 is a block circuit diagram of a tape recorder whose operation is switched to recording, reproduction, or muting by means of the switching circuit of the invention.
Figure 6:
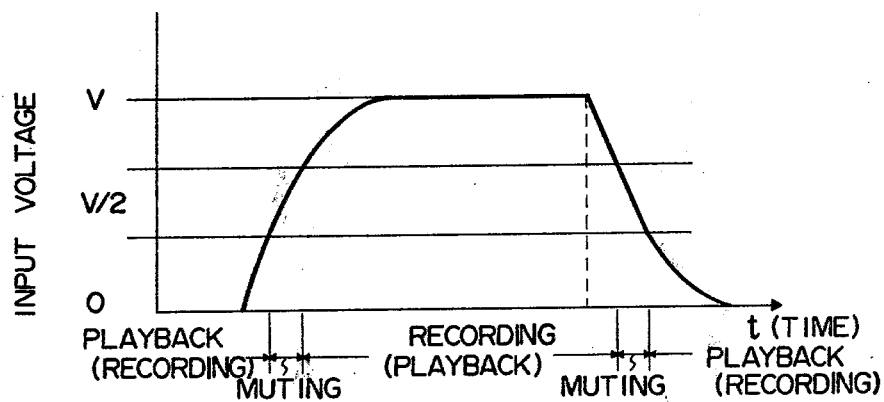
FIG. 6 graphically sets forth variations in the voltage of an input signal supplied to the input line of the switching circuit of FIG. 5 as measured relative to recording, muting and playback.

Where, with the circuit arrangement of FIG. 5, the operation of the switch 34 is changed over by shifting the connection of the common terminal 36 from the grounded terminal 44 to the terminal 42 connected to the positive power source +V, an input signal shown in FIG. 6 is supplied to the input terminal 10 of the switching circuit 30 included in the integrated circuit 52. Now let it be assumed that connection of the common terminal 36 to the terminal 42 indicates, for example, a playback state. Then, connection of the common terminal 36 to the terminal 44 represents a recording state. When the connection of the common terminal 36 is shifted from the terminal 42 to the terminal 44, a muting state never fails to appear for the following reason. When the common terminal 36 is connected to the terminal 42, the switching circuit 30 supplies a voltage of $V_{BE}$ to the first output line 16 and a voltage of $3V_{BE}$ to the second output line 18. The decoder 46 operates the playback circuit 50 in accoreance with the levels of output voltages from the two output lines 16, 18. Where, under this condition, the connection of the common terminal 36 is shifted to the terminal 44, then a voltage applied to the input terminal 10 does not immediately rise to a level of +V, but gradually varies while passing through the integration circuit 32. Since a voltage of about +V/2 is applied to the input terminal 10, the switching circuit 30 supplies a voltage of $V_{BE}$ to the first output line 16 and similarly a voltage of $V_{BE}$ to the second output line 18. When detecting the voltage of the two output lines 16, 18, then the decoder circuit 46 temporarily actuates the muting circuit 48.

The voltage applied to the input terminal 10 rises to a level of +V in a sufficient length of time after connection of the common terminal 36 to the terminal 44, namely, after lapse of a certain delay time. When the voltage of +V is reached, the switching circuit 30 applies a voltage of $3V_{BE}$ to the first output line 16 and a voltage of $V_{BE}$ to the second output line 18.

The integrated circuit 52 never fails to provide a muting state when the playback state is shifted to the recording state, or vice versa, and further has the advantage of enabling said shifting to be effected through a single input terminal or input pin.

The switching circuit of this invention which is provided with a single input pin and has a simple circuit arrangement is adapted to be intgrated. It will be noted, however, that the switching circuit of the invention need not be of the integrated type, but obviously may be of the discrete type.

As described above, this invention provides a switching circuit of simple arrangement which produces output signals capable of representing the prescribed three states in accordance with the level of D.C. voltage applied to a single input line.

What is claimed is:
1. A switching circuit which comprises:
a current source including an input line for receiving an input signal, first and second signal current lines supplied with differential signal currents ($I_0 + \Delta I$), ($I_0 - \Delta I$) respectively, whose total amount remains constant and one of which has an increment $+\Delta I$ corresponding to a decrement $-\Delta I$ in the other and third signal current line supplied with a constant current;
a first pair of diodes connected in parallel in the opposite directions between the first and third signal current lines and in which the direction of current varies in accordance with the value of current variation $\Delta I$;
a second pair of diodes connected in parallel with each other in the opposite directions between the second and third signal current lines and in which the direction of current varies in accordance with the value of current variation $\Delta I$;
first and second constant current circuits connected to the first and second signal current lines respectively to restrict an amount of input current to the prescribed level; and
first and second output lines which are connected to the first and second signal current lines respectively, and output voltages from which vary in the level with the direction of current passing through the first and second pairs of diodes.

2. The switching circut according to claim 1, wherein the constant current circuit includes first and second transistors, whose collectors are connected to the first and second signal current lines respectively; whose emitters are mutually connected; and whose bases are commonly connected to a junction between the first and second pairs of diodes.

3. The switching circuit according to claim 2, wherein the constant current circuit further includes a diode connected between the junction and the mutually connected bases of the first and second transistors.

4. The switching circuit according to claim 3, wherein the constant current circuit further includes a diode connected between the mutually connected bases of the first and second transistors and the mutually connected emitters thereof.

5. The switching circuit according to claim 1, 2, 3 or 4, wherein the switching circuit is of the integrated type, and in which the diodes are transistors whose bases and collectors are connected together.

6. The switching circuit according to claim 2, 3 or 4, wherein the mutually connected emitters of the first and second transistors are grounded.

7. The switching circuit according to claim 2, 3 or 4, wherein the mutually connected emitters of the first and second transistors are connected to a negative power source.

8. The switching circuit according to claim 1, wherein the current source comprises a first transistor whose base is connected to the input line of the switching circuit, and whose collector is connected to a positive power source; a second transistor whose base is grounded, and whose collector is connected to a positive power source; a first multicollector transistor whose emitter is connected to the emitter of the first transistor, and one collector of which is connected to the first current line; a second multicollector transistor, whose emitter is connected to the emitter of the second transistor, one collector of which is connected to the second signal current line and whose base is connected to the base of the first multicollector transistor; and a third transistor whose collector is connected to the other collectors and bases of the first and second multicollector, whose base is supplied with constant bias voltage, and whose emitter is connected to the third signal current line.

9. The switching circuit according to claim 1, wherein an integration circuit is connected to the input line of said switching circuit.

* * * * *